United States Patent [19]

Sparber

[11] 4,047,104
[45] Sept. 6, 1977

[54] OHMMETER FOR CIRCUITS CARRYING UNKNOWN CURRENTS

[75] Inventor: Richard Grant Sparber, Wheaton, Ill.

[73] Assignee: Bell Telephone Laboratories, Incorporated, Murray Hill, N.J.

[21] Appl. No.: 709,429

[22] Filed: July 28, 1976

[51] Int. Cl.² .................................. G01R 27/02
[52] U.S. Cl. ............................................ 324/62
[58] Field of Search ................................ 324/62

[56] References Cited

U.S. PATENT DOCUMENTS

| | | | |
|---|---|---|---|
| 1,905,348 | 4/1933 | Edwards et al. | 324/62 |
| 2,578,455 | 12/1951 | Seely | 324/62 |
| 3,172,038 | 3/1965 | Goodman, Jr. | 324/62 |
| 3,417,331 | 12/1968 | Gauss, Jr. | 324/62 |
| 3,675,122 | 7/1972 | Rose | 324/62 |

*Primary Examiner*—Stanley T. Krawczewicz
*Attorney, Agent, or Firm*—Henry J. Walsh

[57] ABSTRACT

A direct reading ohmmeter for neutralizing the effects of foreign voltages is disclosed including alternately connected stages for registering the Thevenin Equivalent open circuit voltage across test probes as well as a voltage whose value is a function of the resistance to be measured, and circuitry monitoring these stages for determining the value of the unknown resistance by a continuous subtraction of the stored voltages.

10 Claims, 2 Drawing Figures

OHMMETER FOR CIRCUITS CARRYING UNKNOWN CURRENTS

BACKGROUND OF THE INVENTION

This invention concerns a direct reading resistance measurement device and in particular an ohmmeter capable of measuring resistance values in circuits powered by unknown voltages.

Conventional direct reading ohmmeters furnish a low current through measuring probes which extend from the meters to touch the tested circuit. The resistance value of the tested circuit is determined as a function of that current and is usually indicated on a calibrated meter or digital display. While this ohmmeter performs satisfactorily in most instances, the presence of foreign voltages in the tested circuit will cause erroneous ohmmeter readings (false resistance values) and may even destroy the sensitive low current circuits and meter movements of conventional ohmmeters.

Accordingly, it is an object of my invention to provide an electrical measuring device which neutralizes the effect of a foreign voltage in a circuit whose resistance is being measured.

It is also an object of my invention to provide a direct reading ohmmeter which may be connected in conventional fashion via two probes across electrical devices in powered circuits for indicating the value of resistance between the probes and for nullifying the effects of foreign voltages.

STATEMENT OF THE INVENTION

The foregoing as well as other objects of the present invention are realized in a specific illustrative embodiment of an ohmmeter which comprises two voltage storage stages and a switching stage for alternately connecting each of the storage stages to meter probe conductors for registering continuously updated values of the voltage across the probe tips. A constant current source in parallel with one of the voltage storage stages is also connected to the conductors resulting in a net change of the voltage value stored by that stage. A voltage which is a function of the resistance value of the circuit being measured is derived through a continuous (in time) subtraction which is performed between the two storage stages. Advantageously, foreign voltages in the circuit under test are also nullified in the subtraction process. In conventional fashion the voltage continuously being determined by subtraction is applied to a meter movement or digital display to give a directly readable indication.

It is a feature of this invention that d.c. as well as a.c. voltages in the circuit under test can be neutralized and the resistance value of the circuit measured accurately.

BRIEF DESCRIPTION OF THE DRAWING

A complete understanding of the present invention and of the above and other objects, features and advantages may be gained from a consideration of the following detailed description in conjunction with the accompanying drawing in which.

DESCRIPTION OF THE PREFERRED EMBODIMENT

Figure 1:
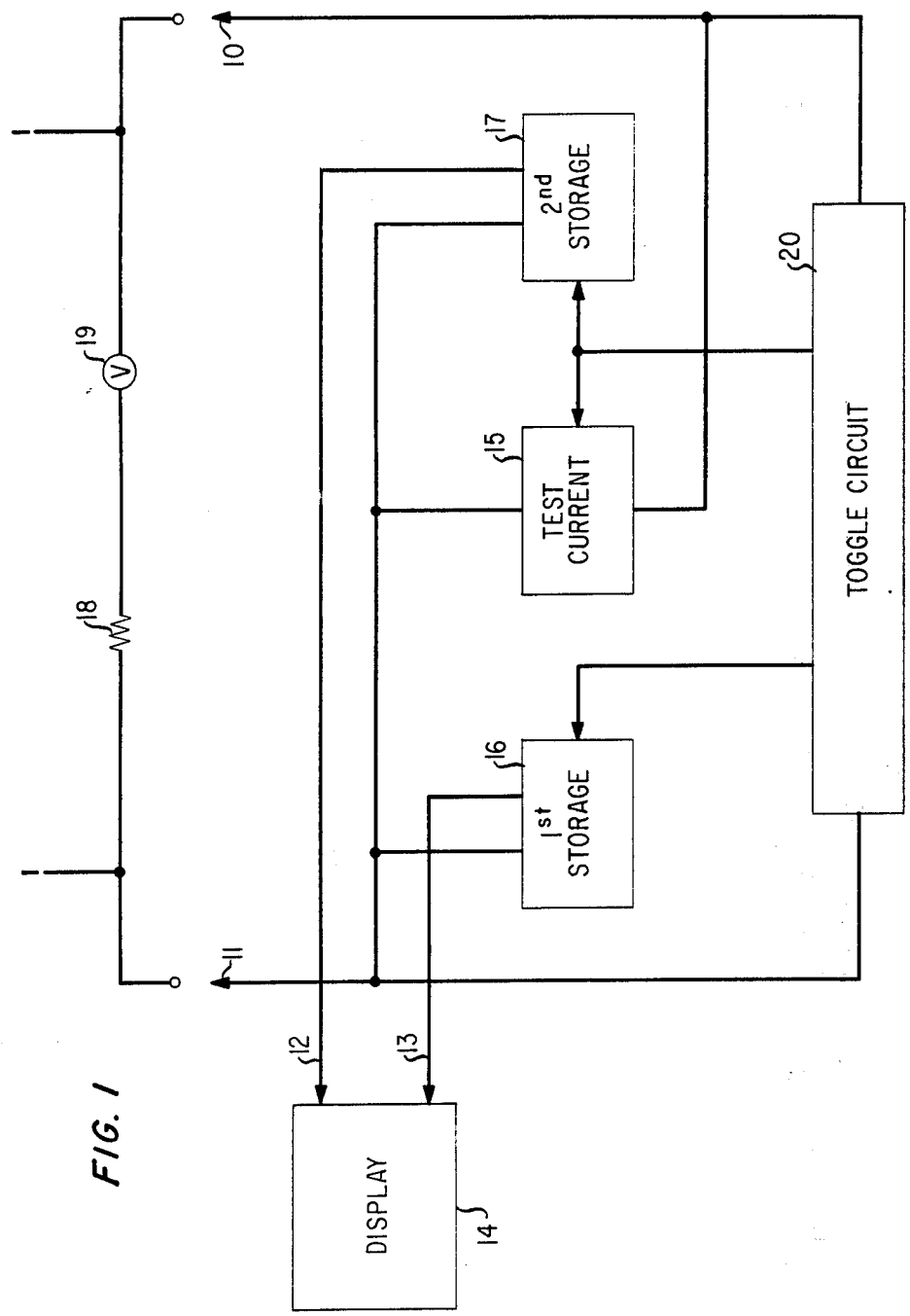
FIG. 1 is a diagram, for the most part in block form, illustrating an exemplary ohmmeter made in accordance with the principles of the invention.

Referring first to FIG. 1, it shows the essential components of the ohmmeter. Resistor 18 shown at the top of the drawing is illustrative of either a single device or a circuit network resistance which is to be measured. Voltage generator 19 illustrates an unknown source, in this instance connected in series with resistor 18. As will be explained hereinafter the remaining circuit shown here in block form is capable of neutralizing the effects of external generator 19 and indicating the resistance value of resistor 18.

Simply stated the ohmmeter circuit makes two separate measurements. In the first it detects and stores the value of the open circuit voltage across probes 10 and 11. In the second measurement it detects and stores a value which includes the open circuit voltage and a contribution from an internal test current source 15 which is connected to probes 10 and 11. When the stored values are subtracted, the result is a function of the resistance value of unknown resistor 18 with the unknown voltage in the measured circuit neutralized.

During the first measurement the value of the open circuit voltage, or Thevenin Equivalent voltage ($V_{th}$), is stored in stage 16. The latter is periodically coupled through toggle circuit 20 to probe 10; probe 11 is permanently connected to stage 16. Alternating with the connection of stage 16 across the probes, storage stage 17 combined with test current source 15 is coupled via toggle circuit 20 to the same probes. In this second measurement stage 17 records the Thevenin Equivalent voltage in addition to the contribution which results from connecting test current source 15 to external resistor 18.

The value of resistor 18 is determined from a continuous (in time) subtraction of the voltage values stored (and periodically updated) on stages 16 and 17. As shown in FIG. 1, display 14 monitors stages 16 and 17 via leads 12 and 13 even while toggle circuit 20 switches each of those stages alternately and continuously onto probes 10 and 11.

In the discussion thus far we have not identified the foreign voltage (source 19) as either an a.c. or d.c. source. Advantageously, the present invention is capable of nullifying the effects of foreign a.c. and d.c. voltages. However, the discussion of this feature is best reserved until after the detailed operation.

DETAILED DESCRIPTION

Figure 2:
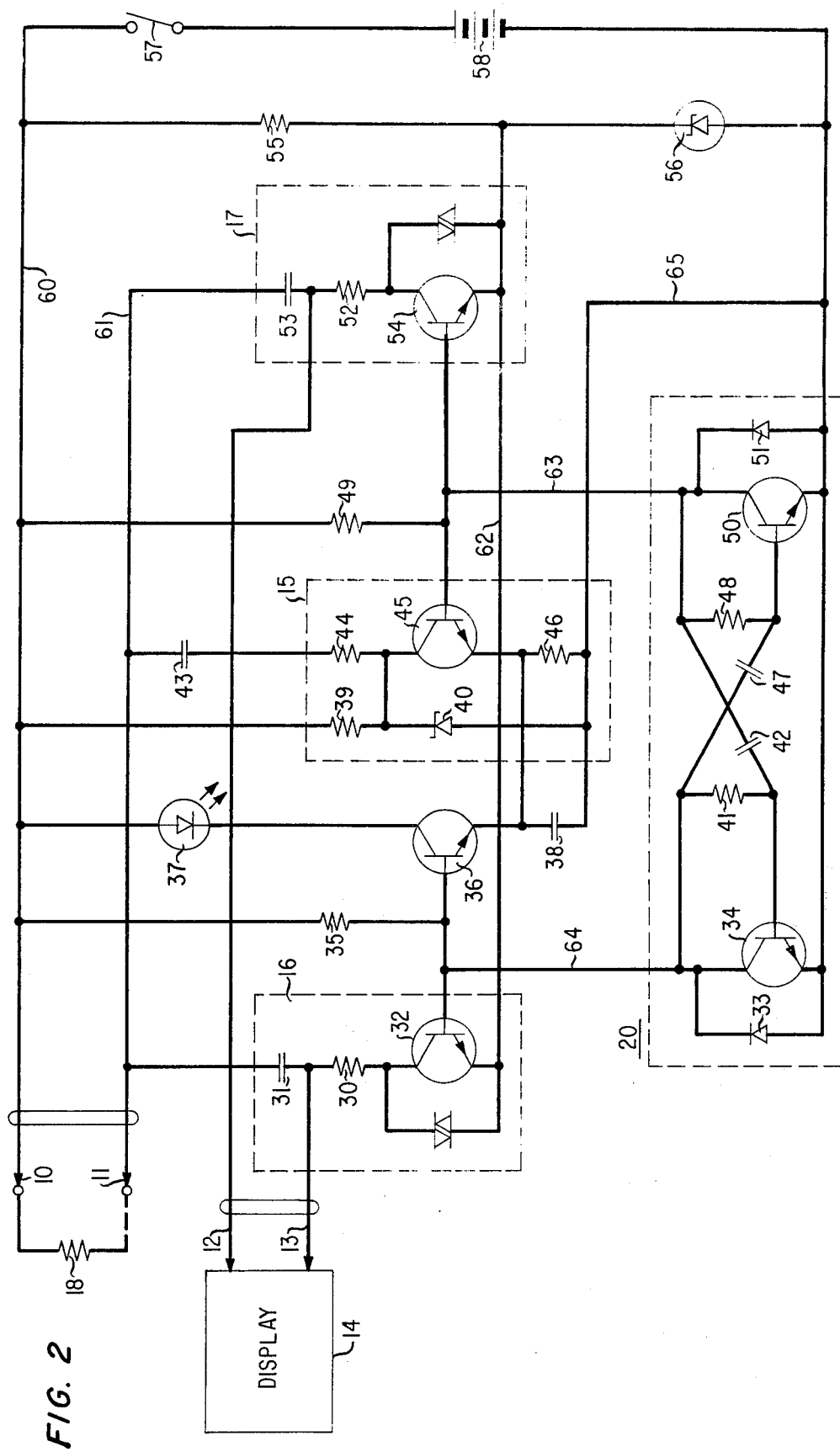
FIG. 2 depicts a specific illustrative circuit in schematic form corresponding to the block diagram of FIG. 1.

Turning now to FIG. 2, let us consider in greater detail the circuitry of the ohmmeter. It should be immediately apparent from the previous discussion that resistor 18 (shown to the upper left) represents the unknown resistance to be measured. Switch 57 is closed to apply power from battery 58 to turn the ohmmeter on. The internal ohmmeter circuitry, as discussed previously, consists essentially of four major sections connected to resistor 18 via probes 10 and 11. These are the two voltage storage stages 16 and 17 which comprise transistors 32 and 54, respectively, and their associated circuitry including capacitors 31 and 53, respectively; the test current generator 15 which includes transistor 45 and resistors 39 and 46; and a switching stage, or toggle circuit 20.

Toggle circuit 20 operates as a free running bistable multivibrator or oscillator alternately supplying a clamping potential to turn off transistors 32, 36, 45, and 54. The base circuits of transistors 32 and 36 are coupled together so as to be controlled concurrently via lead 64. Similarly, the bases of transistors 45 and 54 are interconnected and operated via lead 63 in unison alternating with the operation of transistors 32 and 36. For a more detailed discussion of the operation of multivibrators, in general, usable in this configuration, reference may be made to page 186 et. seq. of *TRANSISTOR MANUAL*, 7th edition, published by the General Electric Company.

Voltages measured by the ohmmeter and from which eventually the external resistance value is calculated are stored on the devices within the small dashed line boxes shown on the top left and right hand sides of the drawing. Stage 16 (left side) stores the Thevenin Equivalent open circuit voltage and stage 17 stores that voltage as well as a contribution from the test current generator as will be explained. Stage 16 and 17 are connected together; i.e., capacitors 31 and 53 are interconnected via lead 61. At their opposite ends capacitors 31 and 53 are coupled via leads 12 and 13 to display 14. Thus, it will be appreciated that the potential across leads 12 and 13 is actually the instantaneous difference between the voltages stored on capacitors 31 and 53.

Considering initially stage 16, capacitor 31 is charged to the value of the open circuit voltage across probes 10 and 11 by the action of transistor 32. The latter, when driven into a fully saturated state (turned on) by toggle circuit 20, effectively connects capacitor 31 to probe 10. Toggle circuit 20 turns on transistor 32 by removing the base potential from lead 64. The connection to probe 10 may be traced from capacitor 31 via resistor 30, the collector - emitter junction of transistor 32, lead 62, zener diode 56, battery 58, switch 57, and lead 60 to probe 10. The opposite terminal of capacitor 31 is connected via lead 61 to probe 11. Capacitor 31 charges and recharges periodically governed by the toggle circuit 20 switching period until in the steady state condition it is charged to the open circuit voltage across probes 10 and 11.

Stage 17 operates substantially the same way on alternating cycles of toggle circuit 20 to connect capacitor 53 across probes 10 and 11. However, there is an important difference. When toggle circuit 20 removes the potential from lead 63 (after replacing the activating potential on lead 64) transistor 45 is turned on to connect a constant current supply between leads 60 and 61. The path for the foregoing may be traced from lead 61 via capacitor 43 and resistor 44, the emitter-collector junction of transistor 45 and resistor 46 which returns to lead 60 via lead 65, power supply 58 and switch 57. Capacitor 43 in the latter path is used to limit the effective steady state voltage across the emitter-collector junction of transistor 45 to prevent its destruction in the event of a high d.c. foreign potential. In addition to transistor 45, transistor 54 is also turned on to connect capacitor 53 across leads 60 and 61. This path may be traced from capacitor 53 via resistor 52, the emitter-collector junction of transistor 54 and diode 56, power supply 58 and switch 57 to lead 60.

Thus, it can be seen that capacitor 53 charges to the steady state value of the open circuit voltage (unknown) across probes 10 and 11 in addition to the voltage drop across the measured resistance due the current driven by transistor 45. When the voltage stored on capacitor 53 is effectively subtracted from the voltage on capacitor 31 (as seen from leads 12 and 13) the foreign potential is neutralized leaving only the voltage difference which is a function of resistor 18. Since the current through resistor 18 is a known value controlled by transistor 45, the mechanism of display 14 can be calibrated in a straightforward manner directly to read to resistance value.

Transistor 36 which is driven concurrently with transistor 32, discussed previously, satisfies circuit symmetry constraints and operates light emitting diode 37 to indicate a power-on condition.

Diode 40 acts to limit the voltage excursion across transistor 45 to a safe level. This is particularly critical when probes 10 and 11 are first connected to an external circuit having high voltages. Similarly, resistors 30 and 52 in stages 16 and 17 are inserted in series with capacitors 31 and 53 to limit surge currents as well as to form low pass filter sections as explained in the next section. These resistors however do not effect the voltage storing function of capacitors 31 and 53 after the steady state condition is achieved.

EXTERNAL A.C. VOLTAGE

A unique feature of this invention is that external a.c. voltages may also be neutralized effectively for a wide range of frequencies encountered. As explained previously, capacitors 31 and 53 are periodically connected via probes 10 and 11 to store a periodically updated sample of the external voltage. When dealing with an external low frequency a.c. voltage the sampling rate under control of oscillator 20 is important. The oscillator period should be selected to be relatively fast compared to the frequency (low) of the external voltage. In that way the amplitude difference, if any, between the sampled voltage values stored on capacitors 31 and 53 has a negligible contribution to the voltage difference which is to be read as a function of the measured resistance.

As the frequency of the external a.c. voltage increases, advantageously, the characteristic of the networks of which capacitors 31 and 53 are a part becomes important. Capacitor 31 together with resistor 30 as well as the network comprising capacitor 53 and resistor 52 form a low pass filter section. Thus, as the frequency of the external voltage increases the impedance of each network increases severely attenuating the value of the sampled external voltage stored on capacitors 31 and 53. Thus, by a judicious selection of the storage capacitor and its companion series resistor one can obtain a low pass filter which attenuates unwanted high frequency a.c. voltages. By coordinating this selection with the selection of the oscillator 20 frequency to reduce the difference frequency problem on low frequency external voltages, one can obtain effectively distortion-less readings over a wide range of external a.c. voltages.

What is claimed is:
1. An ohmmeter circuit for measuring the resistance of a powered circuit comprising a pair of probes extending from said circuit for engagement with portions of said powered circuit; a first and second voltage storing means connectable to said probes; switching circuitry for controlling in alternating fashion the connection of said first and second voltage storing means to said probes; a current source associated with said first voltage storing means and being connected concurrently therewith to said probes by said switching circuitry; and a directly readable display connected to said first and second voltage storing means for indicating as a function of the difference of voltages stored thereon the resistance of said powered circuit between points therein touched by said probes.

2. The invention recited in claim 1 wherein said first and second voltage storing means each comprises a capacitor.

3. The invention recited in claim 1 wherein said switching circuitry comprises a free-running multivibrator having alternately operated transistors for controlling the connection of said first and second voltage storing means to said probes.

4. The invention recited in claim 3 further including separately operable switching means associated with each of said storing means coupled to different ones of said transistors for connecting each of said storing means to said probes.

5. An ohmmeter including a display indicator for measuring the resistance value of electrical devices connected to an energized circuit operable for direct reading of numerical indications indicative of resistance values, a measuring circuit having two test probes extending therefrom, characterized in that said measuring circuit includes first and second voltage storage devices, an oscillator driven switching arrangement for selectively connecting each of said devices to said test probes in alternating fashion, a constant current source in parallel with said first voltage storage device, and means connected in series with said first and second storage devices for furnishing signals proportional to measured resistance values to said display indicator.

6. A directly readable ohmmeter control circuit having a pair of probes extending therefrom for electrical engagement with a circuit element powered by unkown voltages for determining the value of resistance of said circuit element comprising a pair of capacitors each having a terminal thereof tied in common and having said common terminal connected to a first one of said probes, separately controllable switching apparatus connected between opposite terminals of each of said capacitors and a second one of said probes, a toggle circuit having two outputs which are alternately activated, separate ones of said outputs being connected to operate each of said switching apparatus in alternating fashion, a constant current source, and means for periodically connected said constant current source between said probes in synchronism with the connection of one of said capacitors thereacross.

7. The invention recited in claim 6 including connecting means coupling a directly readable display to each of said opposite capacitor terminals whereby unknown voltages stored on each such capacitor are cancelled and the differences in stored voltages are readable as a function of the value of resistance of said device or circuit.

8. The invention recited in claim 6 further including means associated with each of said capacitors forming therewith a low pass filter for rejection of unknown high frequency a.c. signals.

9. An ohmmeter circuit adapted to determine resistance values in the presence of unknown voltages comprising a pair of circuit probes for engaging either side of a circuit element to be measured, first means extending from one of said probes and connecting to one terminal of each of a pair of voltage storage means, each of said voltage storage means including at least one capacitor, first and second switching apparatus respectively connected between an opposite terminal of each one of said storage means and a second one of said probes, a separate control circuit extending from each one of said switching apparatus, a free running oscillator having a pair of alternately activated output means connected to each of said control circuits, a constant current source including in series therewith, a third control circuit connected to said oscillator, means under control of said third control circuit for connecting said current source between said probes concurrently with the connection of one of said voltage storage means therebetween, and means connecting to said storage means for indicating the value of resistance as a function of the difference between voltages stored thereon.

10. The invention recited in claim 9 wherein each of said voltage storage means includes a resistor associated with said capacitor forming therewith a low pass filter for rejection of unknown high frequency a.c. signals.

* * * * *